(12) United States Patent
Yoshinaga et al.

(10) Patent No.: US 6,388,274 B1
(45) Date of Patent: May 14, 2002

(54) EPITAXIAL WAFER FOR INFRARED LIGHT-EMITTING DEVICE AND LIGHT-EMITTING DEVICE USING THE SAME

(75) Inventors: Atsushi Yoshinaga; Junichi Yamamoto; Akihiro Kitazaki, all of Saitama (JP)

(73) Assignee: Showa Denko Kabushiki Kaisha, Tokyo (JP)

(*) Notice: Subject to any disclaimer, the term of this patent is extended or adjusted under 35 U.S.C. 154(b) by 25 days.

(21) Appl. No.: 09/594,735

(22) Filed: Jun. 16, 2000

Related U.S. Application Data
(60) Provisional application No. 60/159,651, filed on Oct. 18, 1999.

(30) Foreign Application Priority Data

Jun. 18, 1999 (JP) .............................. 11-172482
Sep. 21, 1999 (JP) .......................... 11-266483

(51) Int. Cl.[7] .............................................. H01L 27/15
(52) U.S. Cl. ............................. 257/79; 257/94; 438/22
(58) Field of Search ............................. 257/91, 94, 96, 257/99, 102, 103, 79

(56) References Cited

U.S. PATENT DOCUMENTS

| | | | | |
|---|---|---|---|---|
| 4,912,532 A | * | 3/1990 | Cook et al. .................... | 257/94 |
| 5,115,286 A | * | 5/1992 | Camras et al. ................ | 257/94 |
| 5,432,359 A | * | 7/1995 | Sekiwa ......................... | 257/94 |
| 5,534,717 A | * | 7/1996 | Murasato et al. ............. | 257/94 |
| 6,121,635 A | * | 9/2000 | Watanabe et al. ............. | 257/91 |

FOREIGN PATENT DOCUMENTS

| | | |
|---|---|---|
| JP | 4-367286 | 12/1992 |
| JP | 5-293622 | 11/1996 |

* cited by examiner

*Primary Examiner*—David Nelms
*Assistant Examiner*—Andy Huynh
(74) *Attorney, Agent, or Firm*—Sughrue Mion, PLLC

(57) ABSTRACT

The present invention provides an epitaxial wafer which is obtained by sequentially forming, on an n-type GaAs substrate, a first n-type GaAlAs layer; a second n-type GaAlAs layer; an n-type GaAlAs cladding layer; a p-type GaAlAs active layer which has an emission wavelength of 850–900 nm; and a p-type GaAlAs cladding layer, through liquid phase epitaxy, and, subsequently, removing the n-type GaAs substrate. In the epitaxial wafer, the p-type GaAlAs cladding layer has a thickness of 5–30 $\mu$m; the p-type GaAlAs cladding layer has an oxygen concentration of $3 \times 10^{16}$ atoms/cm$^3$ or less; the p-type GaAlAs cladding layer has a carrier concentration of $1 \times 10^{17}$ cm$^{-3}$ to $1 \times 10^{18}$ cm$^{-3}$; the p-type GaAlAs active layer has a thickness of 0.05–0.4 $\mu$m; the peak carbon concentration of the portion in the second n-type GaAlAs layer within 2 $\mu$m of the interface between the second n-type GaAlAs layer and the first n-type GaAlAs layer is less than $1 \times 10^{17}$ atoms/cm$^3$; the p-type GaAlAs active layer contains germanium as a predominant dopant; the n-type GaAlAs cladding layer has a Ge concentration of $3 \times 10^{16}$ atoms/cm$^3$ or less; and the second n-type GaAlAs layer has a Ge concentration of $3 \times 10^{16}$ atoms/cm$^3$ or less. The invention provides an epitaxial wafer of double-hetero structure for producing high-intensity GaAlAs infrared LEDs.

8 Claims, 10 Drawing Sheets

| No. | Cooling rate of growth initiating portion in second n-type GaAlAs layer (°C/minute) |
|---|---|
| ① | 0.10 |
| ② | 0.15 |
| ③ | 0.20 |
| ④ | 0.25 |
| ⑤ | 0.30 |
| ⑥ | 0.35 |
| ⑦ | 0.40 |
| ⑧ | 0.45 |
| ⑨ | 0.50 |

Ge concentration in n-type GaAlAs cladding layer (/cm3)

EPITAXIAL WAFER FOR INFRARED LIGHT-EMITTING DEVICE AND LIGHT-EMITTING DEVICE USING THE SAME

CROSS REFERENCE TO RELATED APPLICATION

The present application is filed under 35 U.S.C. §111(a), and claims benefit, pursuant to 35 U.S.C. §119(e)(1), of the filing date of Provisional Application No. 60/159,651 filed Oct. 18, 1999 pursuant to 35 U.S.C. §111(b).

FIELD OF THE INVENTION

The present invention relates to an epitaxial wafer for fabricating a high-intensity infrared light-emitting diode which is employed in optical communications and spatial transmission using infrared radiation. The invention also relates to an infrared light-emitting device fabricated from the epitaxial wafer and to an apparatus employing the device.

BACKGROUND ART

Light-emitting devices (hereinafter referred to as LEDs) employing $Ga_{1-x}Al_xAs$ (hereinafter abbreviated as GaAlAs) compound semiconductors have been widely used in a light source in a wavelength range from infrared to visible red light. Although an infrared LED is employed in optical communications and spatial transmission, there has been increasing demand for a high-intensity infrared LED of increased capacity for transmitting data and increased transmission distance.

As has conventionally been known, a GaAlAs LED having a double-hetero structure (hereinafter referred to as a DH structure) exhibits emitted-light intensity higher than that of a GaAlAs LED having a single-hetero structure, and emitted-light intensity is enhanced by means of removing a substrate.

In fabrication of an LED employing a substrate-removed-type structure (hereinafter referred to as a DDH structure), a typical DH structure; i.e., only three layers consisting of a p-type cladding layer, a p-type active layer, and an n-type cladding layer, is epitaxially grown and then a substrate is removed, to thereby reduce the thickness of a produced epitaxial wafer. Such an epitaxial wafer is difficult to handle during processing into a device. In addition, the distance from a bottom surface of the device to the pn junction decreases, and a paste for bonding the device to a conductor migrates through a side face of the device, to thereby disadvantageously short-circuit the pn junction. In order to avoid this problem, a fourth epitaxial layer is added to the DH structure so as to ensure the overall thickness of the substrate-removed and finished epitaxial wafer and the distance from a bottom surface of the device to the junction. This constitution is standard for a DDH structure. The fourth epitaxial layer is designed to have a band gap wider than that of an active layer, so as not to absorb emitted light from the active layer.

The fourth epitaxial layer is advantageously formed as an n-type layer on the side of an n-type cladding layer, in consideration of suppression of overall electric resistance of a device, since in a GaAlAs semiconductor electron mobility is 10 or more times hole mobility. Thus, an n-type layer has an electric resistance lower than that of a p-type layer when carrier concentration and Al compositional proportion in two layers are identical.

When an n-type layer is formed on the side of an n-type cladding layer so as to dispose a p-type cladding layer as an LED surface, two arrangements are possible. In one case, as shown in FIG. 1, an n-type GaAs substrate 1 is employed, and on the substrate, a first n-type GaAlAs layer 2, a second n-type GaAlAs layer 3, an n-type GaAlAs cladding layer 4, a p-type GaAlAs active layer 5, and a p-type GaAlAs cladding layer 6 are epitaxially grown. In the other case, as shown in FIG. 2, a p-type GaAs substrate 7 is employed, and on the substrate, a p-type GaAlAs layer 8, a p-type GaAlAs cladding layer 9, a p-type GaAlAs active layer 10, an n-type GaAlAs cladding layer 11, and a second n-type GaAlAs cladding layer 12 are epitaxially grown.

When epitaxial growth is carried out on a p-type GaAs substrate and a p-type cladding layer is grown first, the distance between the pn junction and the GaAs substrate is smaller than a similar distance provided when an n-type layer is initially grown on an n-type substrate. Thus, the former pn junction is formed at comparatively high temperature. As a result, dopants in an active layer diffuse into the n-type cladding layer, to thereby shift the position of the formed junction from a metallurgical interface to within the n-type cladding layer. Such a phenomenon predominantly occurs when Zn—having low diffusion energy—is employed as a dopant in the active layer. Although this phenomenon is advantageously utilized for elevating output power of red LEDs produced from such an epitaxial wafer, the phenomenon is disadvantageous in view of increase in response speed of LEDs, and preferably the position of the junction interface is not deviated from a metallurgical interface. Alternatively, germanium (hereinafter referred to as Ge) may be employed as a dopant in the active layer, because Ge is less diffusive than Zn. However, when the active layer is doped with Ge at a high concentration so as to elevate data transmission speed, the diffusion phenomenon is not suppressed.

In liquid phase epitaxy, Te is also employed as an n-type dopant. The segregation coefficient of Te increases as temperature decreases. When epitaxial growth is initiated from a p-type substrate, the carrier concentration of the active layer becomes lower than that of a similar active layer provided when epitaxial growth is initiated from an n-type substrate. Thus, injection efficiency decreases, thereby lowering the response speed of an LED.

As described above, when a fourth layer is added to a DH structure, epitaxial growth layers are formed on an n-type substrate, and a fourth n-type layer is added to an n-type cladding layer in an advantageous manner.

The fourth epitaxial layer may comprise two or more layers, in view of facility for constituting epitaxial layers. Specifically, epitaxial growth must be initiated under high Al compositional proportion conditions so as to produce a thick fourth n-type layer. In this case, forward voltage (VF) of a produced device increases due to high Al compositional proportion. In order to prevent increase in VF, the fourth n-type layer is divided into two or more layers, thereby lowering the maximum Al compositional proportion.

SUMMARY OF THE INVENTION

The present inventors have conducted extensive studies on enhancement of intensity of light emitted from an infrared LED having the aforementioned DDH structure, and have developed an epitaxial wafer of the structure having the following characteristics.

Impurities in a p-type cladding layer particularly lower the intensity of light emitted from an LED. Among them, oxygen atoms are the most detrimental. In relation to this, the thickness of the p-type cladding layer has an optimum value.

In this case, when the carrier concentration of the p-type cladding layer is controlled to fall within a certain range, the intensity of emitted light increases further.

Also in this case, the intensity of emitted light increases when the thickness of an active layer decreases.

In an LED having such a structure, a p-type inversion layer is generated at the interface between a first n-type GaAlAs layer and a second n-type GaAlAs layer, thereby possibly causing a thyristor defect. Particularly, the intensity of emitted light decreases considerably when the active layer is thinned.

The thyristor defect is caused by drastic increase (spike-like profile) in acceptor impurity (carbon) concentration of the portion in the second n-type GaAlAs layer within 2 μm of the growth-initiated interface. When the concentration is $1 \times 10^{17}$ cm$^{-3}$ or higher, occurrence of the thyristor defect becomes more likely.

When Ge is employed as a dopant of the p-type active layer in an LED of the aforementioned structure, the intensity of emitted light varies from one production lot to another, even when the LEDs are produced through an identical process. In the course of investigation of the reason for such variation, the inventors have found negative correlation between emitted light intensity and Ge concentration in an n-type cladding layer or a second n-type layer. The present invention has been accomplished on the basis of these findings.

Accordingly, the present invention is directed to the following:

[1] an epitaxial wafer for fabricating an infrared light-emitting device, which wafer is obtained by sequentially forming, on an n-type GaAs substrate, a first n-type Ga$_{1-X1}$Al$_{X1}$As layer (0<X1<1); a second n-type Ga$_{1-X2}$Al$_{X2}$As layer (0<X2<1); an n-type Ga$_{1-X3}$Al$_{X3}$As cladding layer (0<X3<1); a p-type Ga$_{1-X4}$Al$_{X4}$As active layer (0<X4<1) which has an emission wavelength of 850–900 nm; and a p-type Ga$_{1-X5}$Al$_{X5}$As cladding layer (0<X5<1), through liquid phase epitaxy, and, subsequently, removing the n-type GaAs substrate, wherein the p-type Ga$_{1-X5}$Al$_{X5}$As cladding layer has a thickness of 5–30 μm and the p-type GaAlAs cladding layer has an oxygen concentration of $3 \times 10^{16}$ atoms/cm$^3$ or less;

[2] an epitaxial wafer for fabricating an infrared light-emitting device as described in [1], wherein the p-type Ga$_{1-X5}$Al$_{X5}$As cladding layer has a carrier concentration of $1 \times 10^{17}$ cm$^{-3}$ to $1 \times 10^{18}$ cm$^{-3}$;

[3] an epitaxial wafer for fabricating an infrared light-emitting device as described in [1] or [2], wherein the p-type Ga$_{1-X4}$Al$_{X4}$As active layer has a thickness of 0.05–0.4 μm;

[4] an epitaxial wafer for fabricating an infrared light-emitting device as described in [1] or [2], wherein the peak carbon concentration of the portion in the second n-type Ga$_{1-X2}$Al$_{X2}$As layer within 2 μm of the interface between the second n-type Ga$_{1-X2}$Al$_{X2}$As layer and the first n-type Ga$_{1-X1}$Al$_{X1}$As layer is less than $1 \times 10^{17}$ atoms/cm$^3$;

[5] an epitaxial wafer for fabricating an infrared light-emitting device as described in [1] or [2], wherein the p-type Ga$_{1-X4}$Al$_{X4}$As active layer contains germanium as a predominant dopant and the n-type Ga$_{1-X3}$Al$_{X3}$As cladding layer has a germanium concentration of $3 \times 10^{16}$ atoms/cm$^3$ or less;

[6] an epitaxial wafer for fabricating an infrared light-emitting device as described in [1] or [2], wherein the second n-type Ga$_{1-X2}$Al$_{X2}$As layer has a germanium concentration of $3 \times 10^{16}$ atoms/cm$^3$ or less;

[7] a light-emitting diode fabricated by use of an epitaxial wafer for fabricating an infrared light-emitting device as recited in any one of [1] to [6]; and

[8] an optical communications and spatial transmission apparatus employing a light-emitting diode as recited in [7].

DETAILED DESCRIPTION OF THE INVENTION

The epitaxial wafer of the present invention essentially comprises five layers. Accordingly, the epitaxial wafer is obtained by sequentially forming, on an n-type GaAs substrate, a first n-type Ga$_{1-X1}$Al$_{X1}$As layer (0<X1<1); a second n-type Ga$_{1-X2}$Al$_{X2}$As layer (0<X2<1); an n-type Ga$_{1-X3}$Al$_{X3}$As cladding layer (0<X3<1); a p-type Ga$_{1-X4}$Al$_{X4}$As active layer (0<X4<1) which has an emission wavelength of 850–900 nm; and a p-type Ga$_{1-X5}$Al$_{X5}$As cladding layer (0<X5<1), through liquid phase epitaxy, and, subsequently, removing the n-type GaAs substrate. Preferred compositional proportions of the first n-type Ga$_{1-X1}$Al$_{X1}$As layer, the second n-type Ga$_{1-X2}$Al$_{X2}$As layer, the n-type Ga$_{1-X3}$Al$_{X3}$As cladding layer, the p-type Ga$_{1-X4}$Al$_{X4}$As active layer, and the p-type Ga$_{1-X5}$Al$_{X5}$As cladding layer are 0.08<X1< 0.40; 0.08<X2<0.35; 0.22<X3<0.45; 0<X4<0.02; and 0.15<X5<0.40, respectively.

The present invention also encompasses an epitaxial wafer comprising the aforementioned five-layered wafer, in which an additional epitaxial layer is attached to one or both sides of the wafer.

Figure 3:
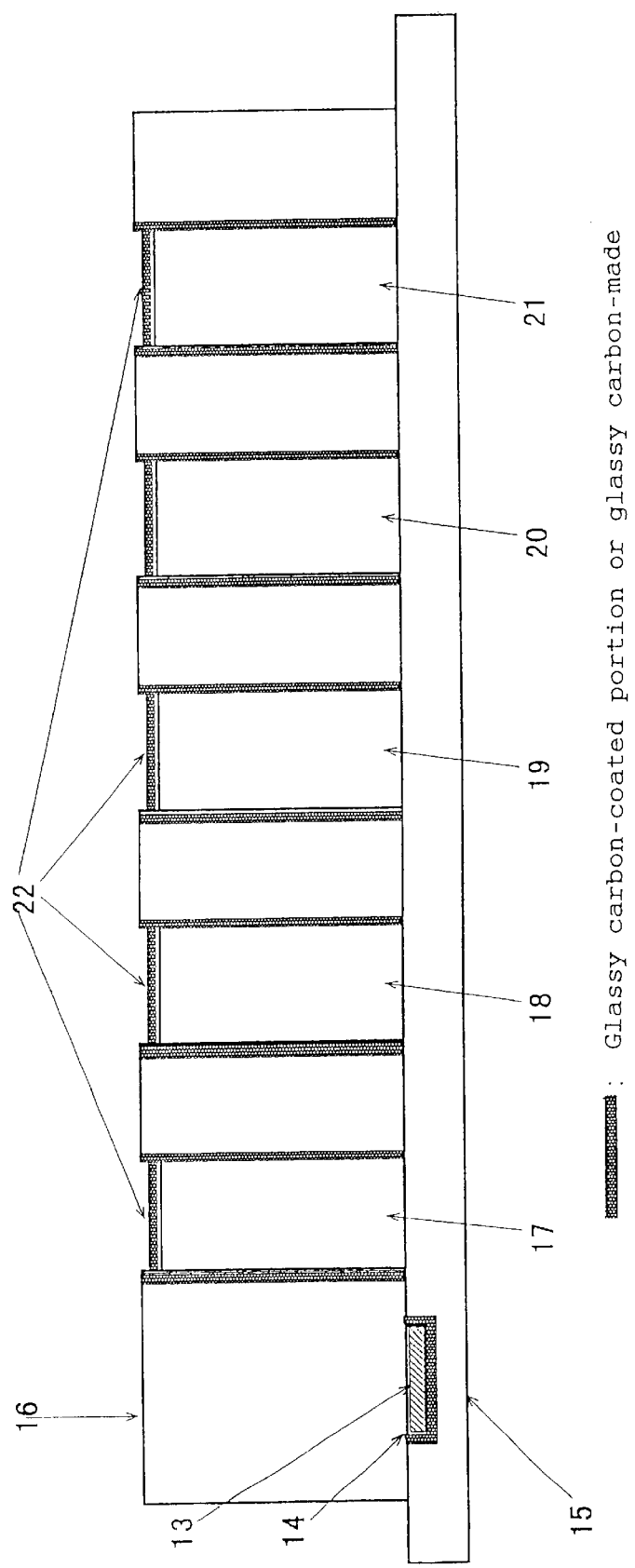
FIG. 3 shows a slide-boat-type growth apparatus employed in carrying out the present invention.

FIG. 3 shows an example of a slide-boat-type growth apparatus which is suitably employed for producing the epitaxial wafer of the present invention. In the slide-boat-type growth apparatus shown in FIG. 3, an n-type GaAs substrate 13 is set in a substrate-holding cavity 14 disposed in a slider 15. In a slide boat 16 are disposed a certain number of crucibles; i.e., equal in number to the layers to be grown. In each crucible are placed metallic Ga, metallic Al, and polycrystalline GaAs in a composition suitable for growth an epitaxial layer, and a dopant suitable for attaining the conduction type and the carrier concentration in the epitaxial layer.

In the present invention, the oxygen concentration in the p-type GaAlAs cladding layer must be controlled to $3 \times 10^{16}$ atoms/cm$^3$ or less. In order to control the oxygen concentration in the p-type GaAlAs cladding layer to $3 \times 10^{16}$ atoms/cm$^3$ or less with good reproducibility, the following measures for suppressing oxygen concentration are employed. Specifically, a GaAs single-crystal substrate and polycrystalline GaAs employed in epitaxial growth are subjected to etching treatment prior to employment. Subsequently, the thus-treated substrate and polycrystalline GaAs are washed with ultra-pure water and dried sufficiently. Commercially available high-purity hydrogen gas and argon are further purified by means of a purifying apparatus so as to serve as gas which forms an atmosphere for carrying out epitaxial growth and feed to a reactor. In addition, a graphite-made epitaxial growth apparatus is baked at 900° C. or higher, to thereby sufficiently remove water attached to the growth apparatus.

In the present invention, Ge concentration in an n-type cladding layer 4 and that of a second n-type layer 3 are preferably lowered. Ge is employed as an impurity in a p-type active layer 5, but is not intentionally added to an n-type layer. Therefore, the presence of Ge in the n-type layer may be considered to result from migration of a Ge-containing solution of Ga for growing a p-type active layer into a solution of Ga for growing an n-type layer during epitaxial growth, and further, diffusion of Ge from a Ge-containing solution of Ga for growing a p-type active layer into a solution of Ga for growing an n-type layer.

In order to prevent migration of Ge into a Ga solution, the following method may be performed. In a slide-boat-type jig employed shown in FIG. 3, inner surfaces of a substrate-holding cavity 13 and crucibles 17 to 21 are coated with glassy carbon. A portion maintaining direct contact with a Ga solution is coated with glassy carbon, to thereby reduce wettability of the coated portion with the Ga solution. As a result, there can be prevented migration of a Ge-containing solution of Ga for growing a p-type active layer into a Ga solution for growing an n-type layer during epitaxial growth.

Furthermore, crucible caps 22 made of glassy carbon are employed. These crucible caps are used so as to prevent vaporization of a dopant impurity contained in a crucible and migration of a dopant impurity occurring from a Ga solution in another crucible. Since the crucible caps 22 are made of glassy carbon having low porosity, vaporization of Ge contained in a Ga solution for growing a p-type layer and migration of Ge into a Ga solution for growing an n-type layer are prevented (Hatched portions in FIG. 3 represent portions coated with glassy carbon or a glassy carbon-made product).

After completion of epitaxial growth by means of the aforementioned epitaxial growth apparatus, the epitaxial wafer is removed and formed into a device. Specifically, the epitaxial wafer is coated with an acid-resistant sheet, and the GaAs substrate is selectively removed through etching by use of an ammonia-hydrogen peroxide etchant.

Subsequently, a gold electrode is formed in each surface of the epitaxial wafer, and elements are isolated through dicing, to thereby fabricate an LED.

Since the infrared LEDs produced according to the present invention exhibit high intensity of emitted light, the LEDs are particularly preferably used in a light-emitting transmission device which is employed in optical communications and spatial transmission using infrared radiation. Thus, devices including the infrared LED of the present invention are employed in optical communications and spatial transmission and are suitable for large-capacity data transmission and long-distance data transmission.

Best Modes for Carrying Out the Invention

The present invention will next be described in more detail by way of examples, which should not be construed as limiting the invention thereto.

EXAMPLE 1

Figure 1:
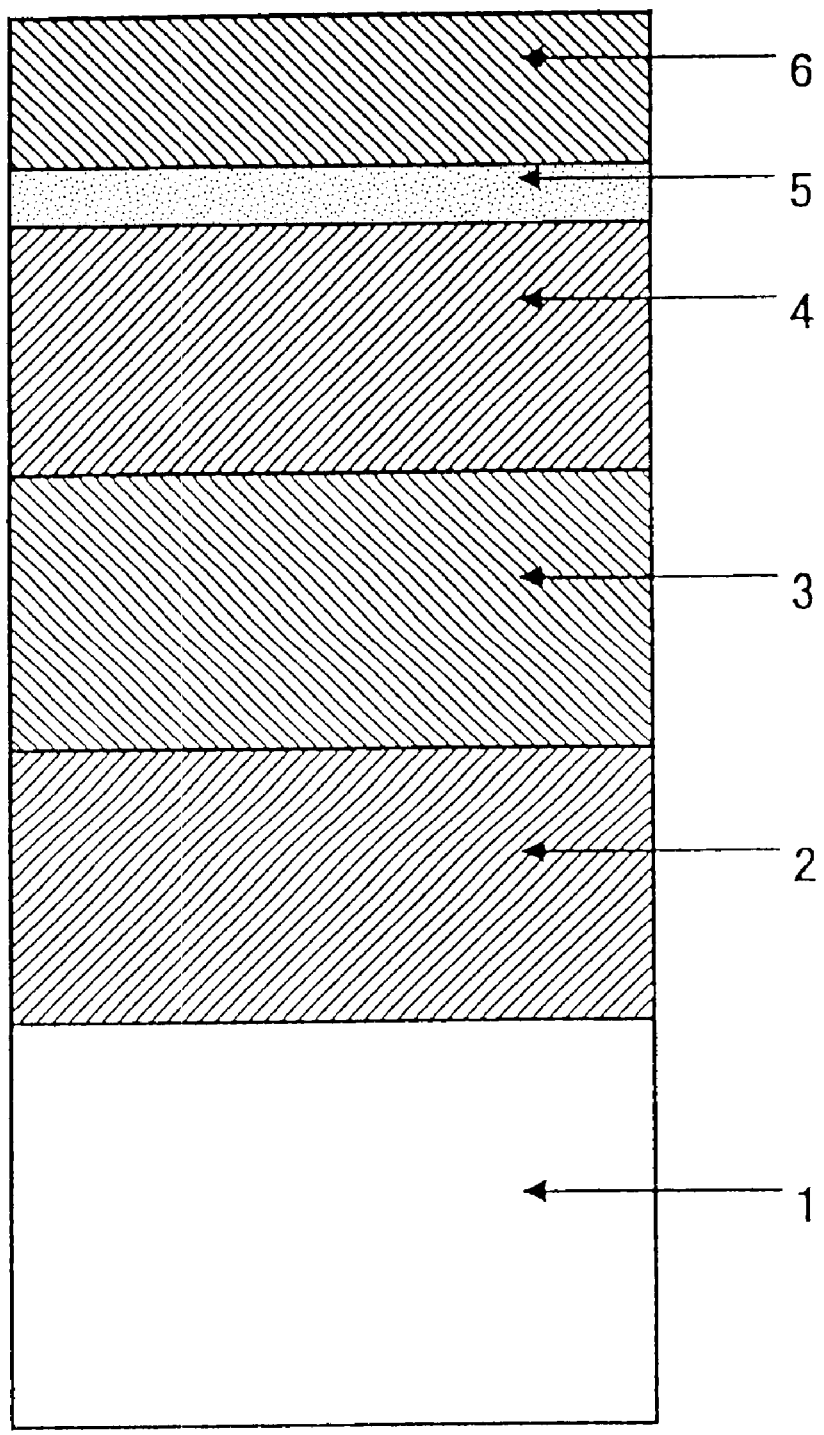
FIG. 1 shows the structure of the epitaxial wafer according to the present invention and a GaAs substrate.
Figure 2:
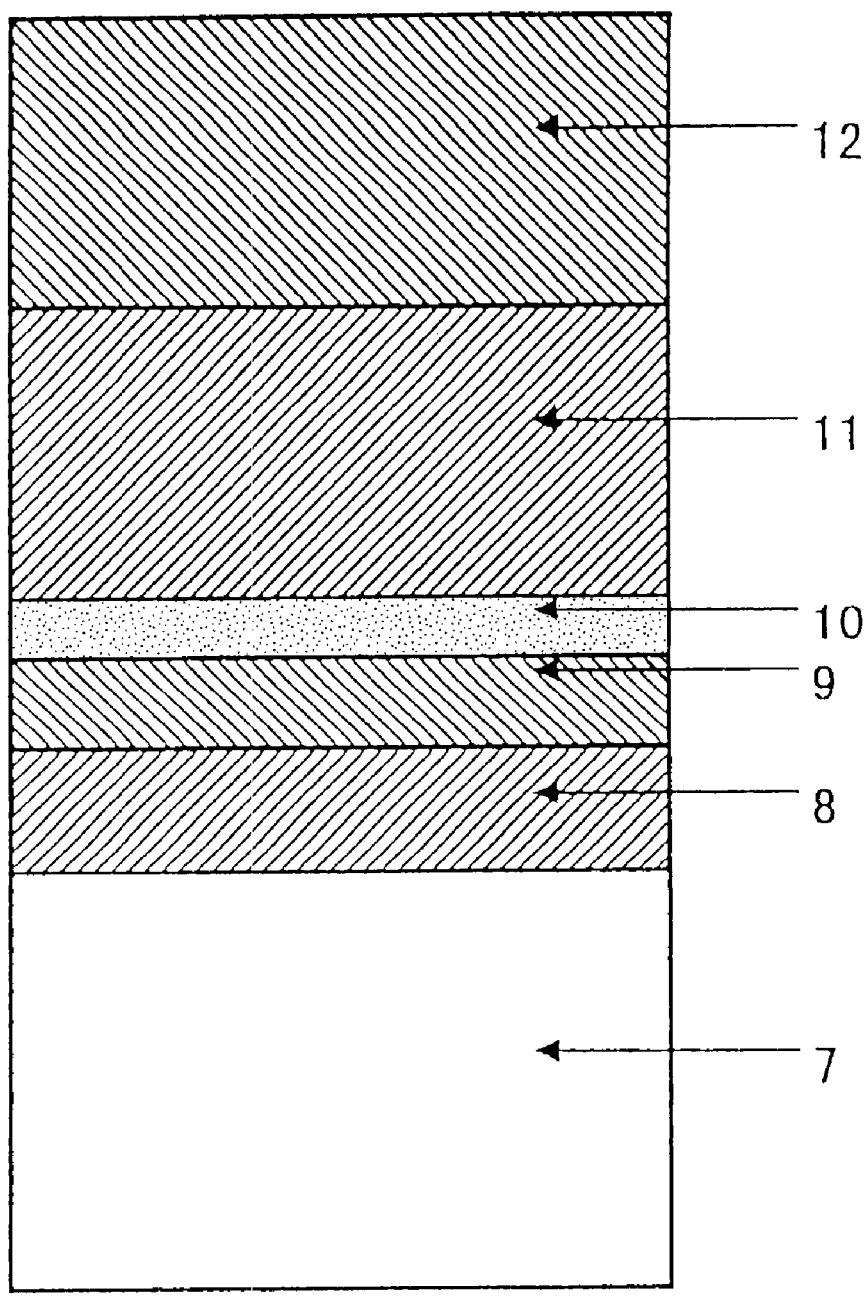
FIG. 2 shows an example of the structure of the epitaxial wafer which is formed on a p-type GaAs substrate.

Epitaxial growth was carried out by means of the aforementioned slide-boat-type growth apparatus shown in FIG. 3, where inner surfaces of the support-holding cavity and crucibles were coated with glassy carbon and glassy carbon-made crucible caps were employed. Specifically, the slide boat shown in FIG. 3 was set in a quartz-made reaction tube (not shown) and baked at 950° C. The slide boat was heated to 950° C. under hydrogen flow, to thereby melt the materials. Subsequently, the temperature of the atmosphere was lowered to 900° C., and the slider 15 was moved rightward so that the n-type GaAs substrate 13 came to a position under the crucible 17, where the n-type GaAs substrate 13 contacted the melt. Then, the temperature of the atmosphere was lowered initially at 0.5° C./minute, to thereby grow on the n-type GaAs substrate a first n-type GaAlAs layer 2 as shown in FIG. 1. Movement of the slider and lowering of the temperature were repeated in a similar manner, to thereby sequentially grow four epitaxial layers having different compositional proportions and corresponding to those shown in FIG. 1; i.e., the second GaAlAs layer 3, the n-type GaAlAs cladding layer 4, the p-type GaAlAs active layer 5, and the p-type GaAlAs cladding layer 6. The film growth was carried out several times. During growth of wafers, the thickness of the formed p-type GaAlAs active layer was varied from 0.02 to 2 µm and that of the formed p-type cladding layer was varied from 0.2 to 42 µm.

Prior to growth, employed polycrystalline GaAs was subjected to etching, washing with ultra-pure water, and drying. Employed gases were purified in advance by means of a purifying apparatus. Thus, for each of the produced epitaxial wafers, the oxygen concentration in the p-type cladding layer is $3 \times 10^{16}$ atoms/cm$^3$ or less.

After completion of epitaxial growth, the wafer was removed. The surface of the p-type cladding layer 6 shown in FIG. 1 was protected with an acid-resistant sheet, and the GaAs substrate 1 was selectively removed through etching by use of an ammonia-hydrogen peroxide etchant. After the acid-resistant sheet was removed, a gold electrode (not shown) was formed in each surface of the epitaxial wafer, and elements were isolated through dicing, to thereby fabricate an infrared LED.

In liquid phase epitaxial growth for producing the LEDs, epitaxial layers were grown by controlling supersaturation degree of growth solutions. An active layer having a thickness of 0.05 µm or less is considerably difficult to grow with good reproducibility.

Figure 4:
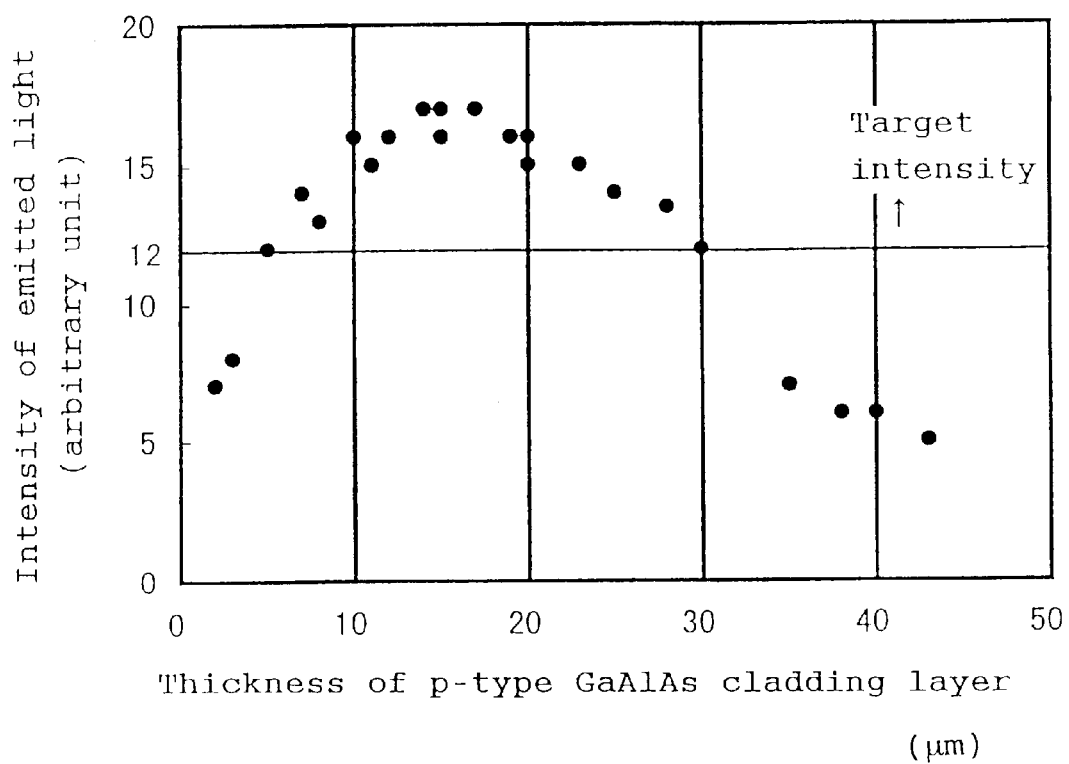
FIG. 4 shows the relationship between thickness of the p-type GaAlAs cladding layer and intensity of emitted light of an LED.

FIG. 4 shows the relationship between thickness of the p-type GaAlAs cladding layer of the LEDs obtained in Example 1 and the intensity of emitted light of the LED. As is clear from FIG. 4, the intensity is comparatively high when the thickness of the p-type GaAlAs cladding layer is 30 μm or less. In addition, it is confirmed that the intensity increases as the layer thickness decreases, and that the intensity is comparatively low when the layer thickness is 5 μm or less. Thus, high intensity can be obtained when the p-type GaAlAs cladding layer has a thickness of 5–30 μm, preferably 10–20 μm.

On the basis of the above results, epitaxial wafers were grown such that the p-type GaAlAs cladding layer is 15 μm thick and has a carrier concentration of $5\times10^{16}$–$5\times10^{18}$ cm$^{-3}$, and LEDs were fabricated from the produced epitaxial wafers.

Figure 5:
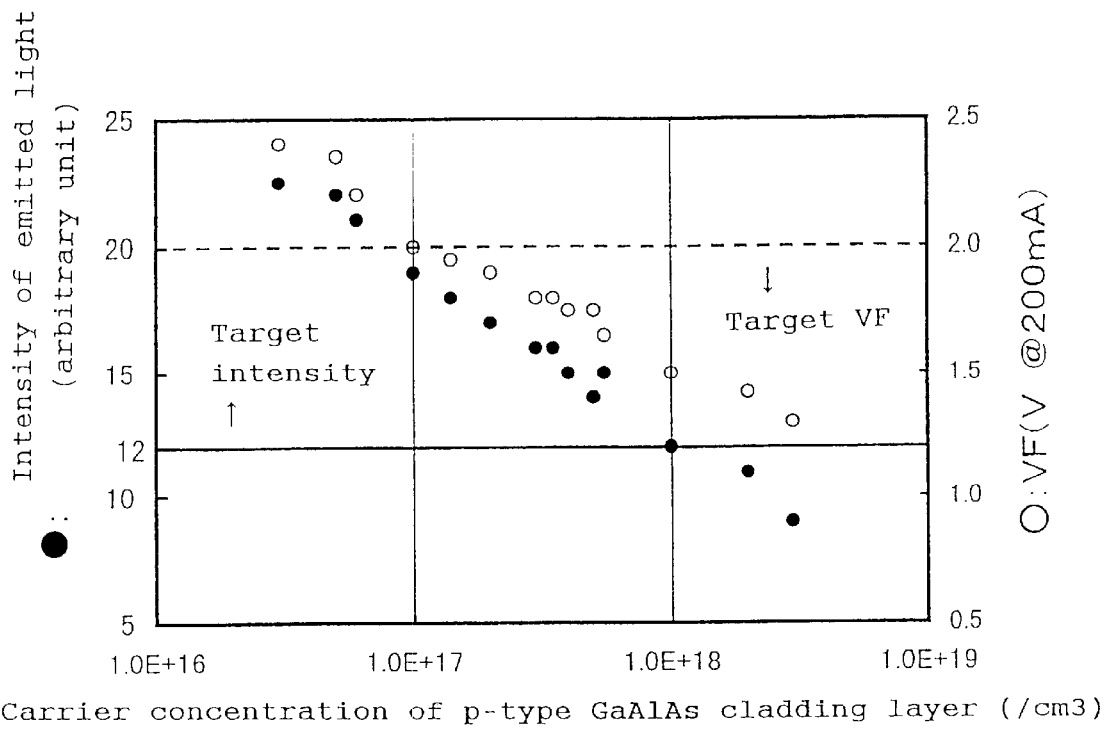
FIG. 5 shows the relationship between oxygen concentration of the p-type GaAlAs cladding layer and intensity of emitted light of an LED.

FIG. 5 shows the relationship between carrier concentration of the p-type GaAlAs cladding layer of the LEDs obtained in the aforementioned manner and intensity of emitted light or VF of the LEDs. As is clear from FIG. 5, the intensity increases as the carrier concentration of the p-type GaAlAs cladding layer decreases. In contrast, when the carrier concentration of the p-type GaAlAs cladding layer decreases, VF of the LEDs increases. VF values shown in FIG. 5 were measured for LEDs having a chip dimension of 350 μm×350 μm (at 200 mA), which is a standard chip dimension. In consideration of practical use of the LEDs, VF (at 200 mA) is preferably controlled to equal to or less than 2.0 V, and the carrier concentration is preferably controlled to $1\times10^{17}$ cm$^{-3}$ or higher. Thus, low VF and high intensity can be obtained when the p-type GaAlAs cladding layer has a carrier concentration of $1\times10^{17}$–$1\times10^{18}$ cm$^{-3}$.

Figure 6:
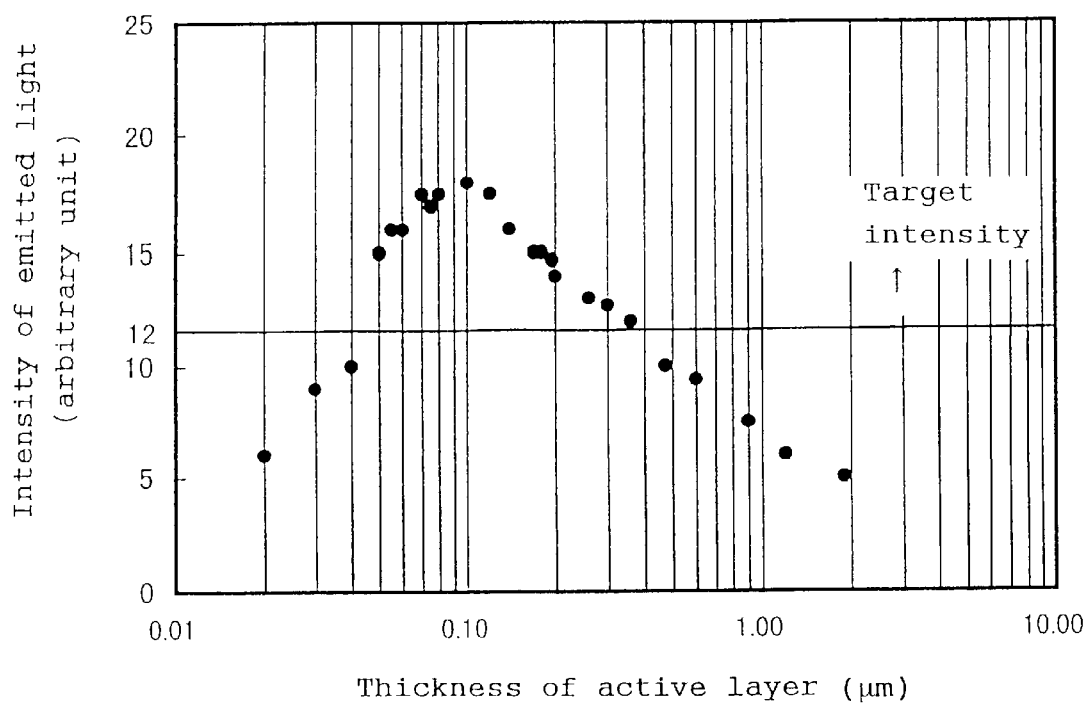
FIG. 6 shows the relationship between thickness of the p-type GaAlAs active layer and intensity of emitted light of an LED.

FIG. 6 shows the relationship between thickness of the p-type active layer of the LEDs obtained in Example 1 and intensity of emitted light of the LEDs. The thinner the active layer, the higher the intensity. Particularly, when the active layer has a thickness of 0.4 μm or less, intensity of emitted light is considerably high. The intensity increases to approximately 20, when the thickness is approximately 0.01 μm. However, when the active layer has a thickness less than 0.05 μm, reproducibility of the thickness declines and radiative recombination at the interface predominates, thereby lowering intensity of emitted light. Thus, intensity of emitted light higher than the target value can be obtained when the p-type active layer has a thickness of 0.05–0.4 μm.

EXAMPLE 2

Epitaxial growth was carried out by means of a jig similar to that employed in Example 1. Specifically, the slide boat shown in FIG. 3 was set in a quartz-made reaction tube, and raw materials were heated to 920° C. under hydrogen flow, to thereby melt the materials. Then, the temperature of the atmosphere was lowered to 900° C. Film growth was carried out in a manner similar to that employed in Example 1. In the growth of the first n-type GaAlAs layer, the temperature of the atmosphere was lowered to 855° C. at 0.5° C./minute. In the growth of the second n-type GaAlAs layer, the temperature of the atmosphere was lowered from 855° C. to 850° C. at 0.2° C./minute and from 850° C. to 800° C. at 0.5° C./minute. In the growth of the n-type GaAlAs cladding layer, the temperature of the atmosphere was lowered from 800° C. to 795° C. at 0.2° C./minute and from 795° C. to 725° C. at 0.5° C./minute, and then maintained at 725° C. for 15 minutes. In the growth of the p-type active layer, the temperature of the atmosphere was lowered to 723° C. at 0.5° C./minute. In the growth of the p-type GaAlAs cladding layer, the temperature of the atmosphere was lowered from 723° C. to 670° C. at 0.5° C./minute.

After film formation was completed, LEDs were fabricated in a manner similar to that employed in Example 1.

EXAMPLE 3

Epitaxial growth was carried out under conditions similar to those employed in Example 2. Seven types of wafers were produced by modifying the rate of lowering temperature from 855° C. to 850° C. during the growth of the aforementioned second n-type GaAlAs layer; i.e., 0.10, 0.15, 0.25, 0.30, 0.35, 0.40, and 0.45° C./minute. After film formation was completed, infrared LEDs were fabricated in a manner similar to that employed in Example 1.

EXAMPLE 4

Epitaxial growth was carried out under conditions similar to those employed in Example 1. However, lowering of the Ge content in the n-type cladding layer and the second n-type layer that was carried out in Example 1 was omitted. Specifically, inner surfaces of the crucibles were not coated with glassy carbon and a portion maintaining direct contact with a Ga solution was not coated with glassy carbon.

The Ge concentration in the n-type cladding layer of the produced epitaxial wafers is $6\times10^{16}$–$1\times10^{17}$ cm$^{-3}$ and that in the second n-type layer is $7\times10^{16}$–$9\times10^{17}$ cm$^{-3}$.

Figure 7:
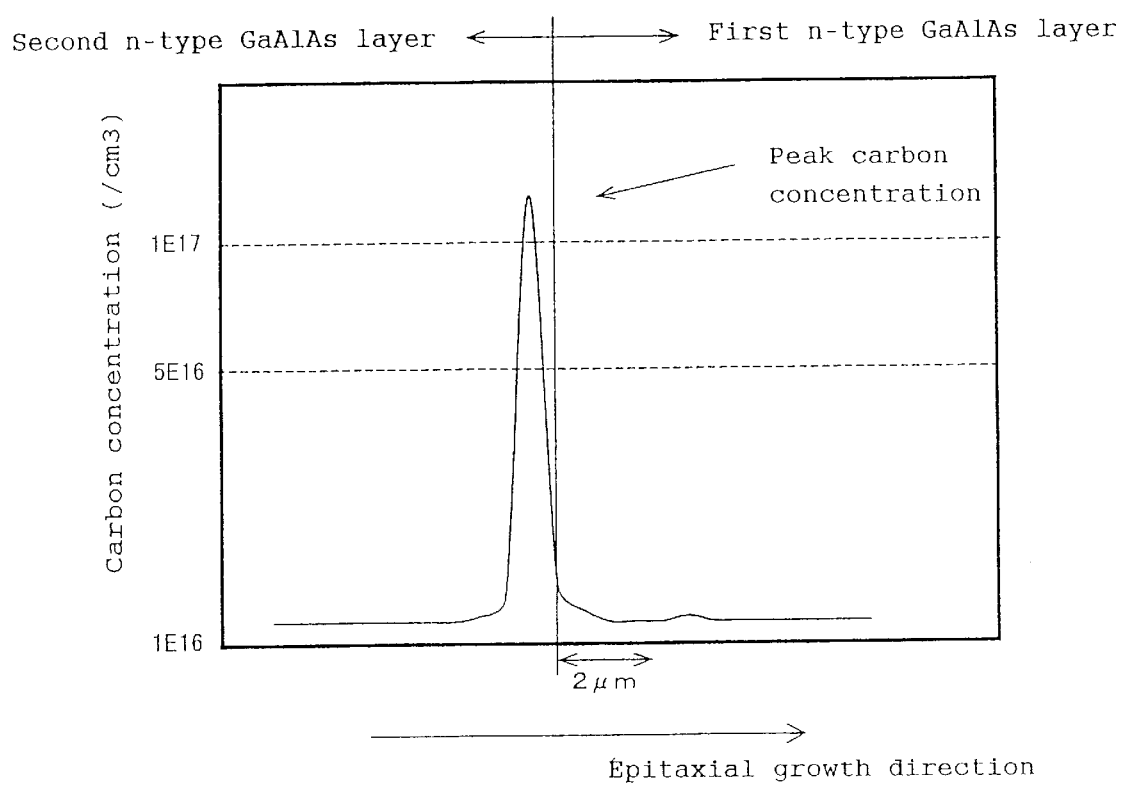
FIG. 7 shows the carbon concentration profile of the interface between the first n-type GaAlAs layer and the second GaAlAs layer.

FIG. 7 shows the results of SIMS analysis of carbon concentration profile near the interface between the second n-type GaAlAs layer and the first n-type GaAlAs layer in LEDs fabricated from a wafer (thickness of p-type cladding layer, 15 μm; carrier concentration $2\times10^{17}$ cm$^{-3}$; thickness of p-type active layer, 0.1 μm; Ge concentration in the n-type cladding layer, $8\times10^{15}$ atoms/cm$^3$; Ge concentration in the second n-type layer, $8\times10^{15}$ atoms/cm$^3$) obtained in Example 1. As is clear from shown FIG. 7, a spike-like profile of carbon concentration is observed in a portion in the second n-type GaAlAs layer in the vicinity of an epitaxial growth initiating portion.

The present inventors have conducted extensive studies, and have found that the peak height of the spike depends on the growth rate of the growth initiating portion in the second n-type layer.

LEDs fabricated under the conditions of Examples 2 and 3 were subjected to a thyristor test. Specifically, LEDs were fabricated from the produced epitaxial wafers, and occurrence of thyristor defect per 100,000 LEDs was counted. The results are shown in FIG. 8.

Figure 8:
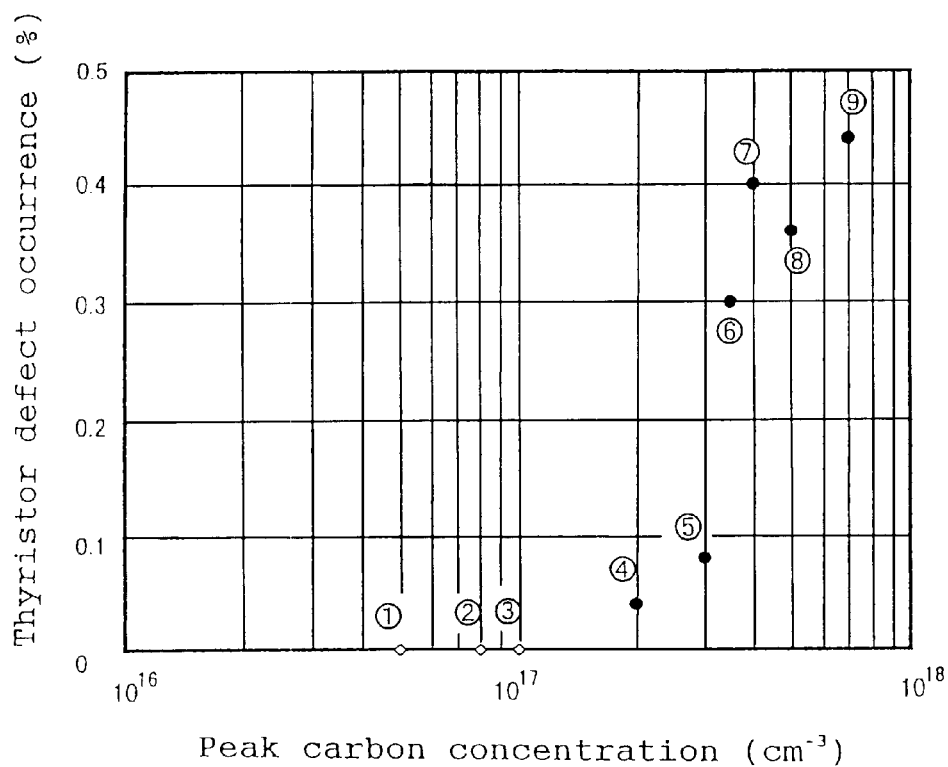
FIG. 8 shows the relationship between occurrence of thyristor defect and peak carbon concentration in the vicinity of the interface between the second n-type GaAlAs layer and the first n-type GaAlAs layer.

FIG. 8 shows the correspondence of temperature lowering rates at initiation of growth of the second n-type GaAlAs layer with reference numbers of epitaxial wafers produced in Examples 2 and 3, and the relationship between thyristor occurrence and peak concentration of carbon in a spike-like profile observed in a portion in the second n-type GaAlAs layer in the vicinity of an epitaxial growth initiating portion. The results indicate that the peak concentration of carbon in the spike profile is controlled to less than $1\times10^{17}$ atoms/cm$^3$ so as to suppress the thyristor defect. In order to control the carbon concentration, the second n-type GaAlAs layer is grown by cooling from 855° C. to 850° C. at 0.2° C./minute or less.

Figure 9:
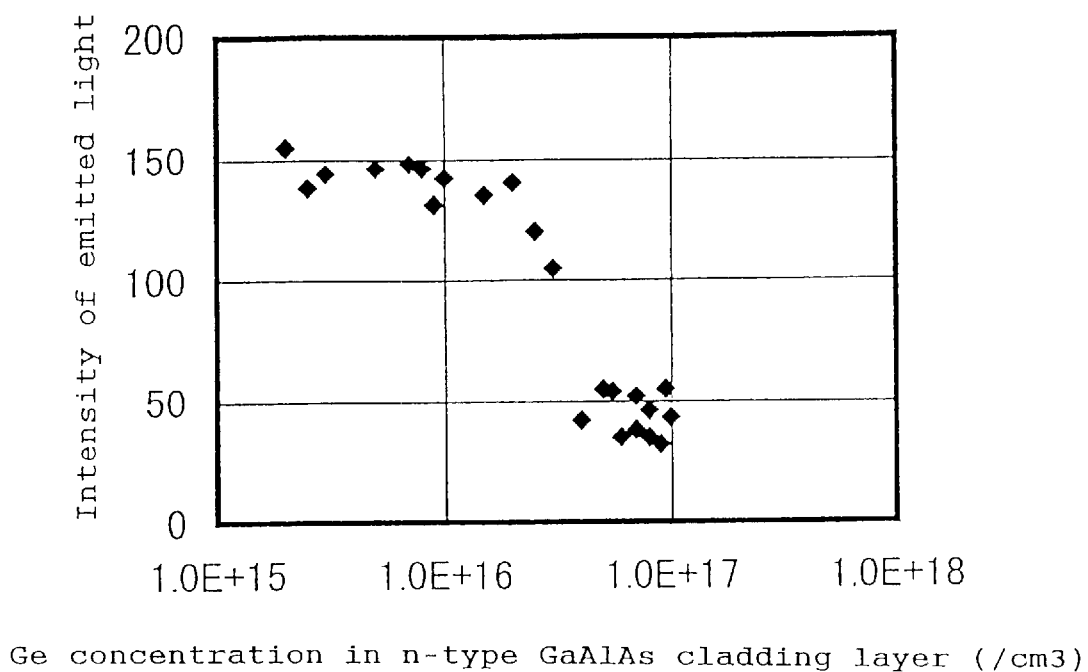
FIG. 9 shows the relationship between Ge atom concentration of the n-type GaAlAs cladding layer and intensity of emitted light of an LED.

FIG. 9 shows the relationship between Ge concentration of the n-type GaAlAs cladding layer of LEDs fabricated in Examples 1 and 4 and intensity of emitted light of the LEDs. As shown in the graph of FIG. 9, LEDs fabricated in Example 1 exhibit intensity of emitted light of 120–160, and LEDs fabricated in Example 4 exhibit intensity of emitted light of 30–65. Conventionally, Ge concentration in an n-type layer has been approximately $5\times10^{16}$ atoms/cm$^3$ or more. However, the aforementioned process for lowering Ge concentration enables control of the Ge concentration to $3\times10^{16}$ atoms/cm$^3$. When Ge concentration of the n-type GaAlAs cladding layer is controlled to $3\times10^{16}$ atoms/cm$^3$ through the above method, intensity of light emitted from infrared LEDs can be enhanced as compared to that obtained conventionally. As shown in FIG. 9, when Ge concentration in the n-type cladding layer is $1\times10^{16}$ atoms/cm$^3$ or less, the intensity of emitted light is approximately constant, whereas when the concentration is in excess of $1\times10^{16}$ atoms/cm$^3$, the intensity begins to decrease. Furthermore, when the concentration is in excess of $3\times10^{16}$ atoms/cm$^3$, the intensity decreases drastically. Thus, a high intensity of emitted light can be obtained by controlling Ge concentration in the n-type cladding layer to $3\times10^{16}$ atoms/cm$^3$ or less, preferably $1\times10^{16}$ atoms/cm$^3$ or less.

Figure 10:
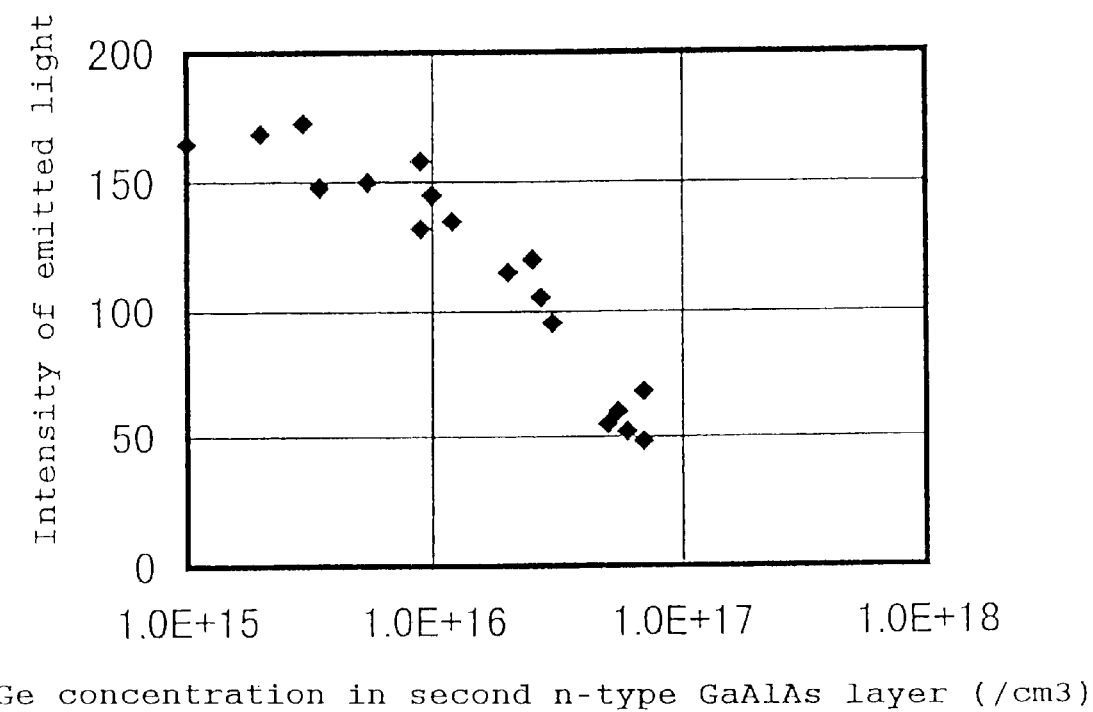
FIG. 10 shows the relationship between Ge atom concentration of the second n-type GaAlAs layer and intensity of emitted light of an LED.

FIG. 10 shows the relationship between Ge concentration of the second n-type GaAlAs layer of LEDs fabricated in Examples 1 and 4 and intensity of emitted light of the LEDs. As shown in the graph of FIG. 10, LEDs fabricated in Example 1 exhibit intensity of emitted light of 100–175, and LEDs fabricated in Example 4 exhibit intensity of emitted light of 50–70. As shown in FIG. 10, when Ge concentration in the second n-type layer is $1\times10^{16}$ atoms/cm$^3$ or less, the intensity of emitted light is approximately constant, whereas when the concentration is in excess of $1\times10^{16}$ atoms/cm$^3$, the intensity begins to decrease. Furthermore, when the concentration is in excess of $3\times10^{16}$ atoms/cm$^3$, the intensity decreases drastically. Thus, a high intensity of emitted light can be obtained by controlling Ge concentration in the second n-type layer to $3\times10^{16}$ atoms/cm$^3$ or less, preferably $1\times10^{16}$ atoms/cm$^3$ or less.

INDUSTRIAL APPLICABILITY

As described hereinabove, the present invention provides an epitaxial wafer for fabricating a high-intensity infrared LED, and an infrared LED fabricated from the epitaxial wafer. Particularly, intensity of emitted light can be enhanced and VF can be reduced by controlling the carrier concentration of the p-type As cladding layer to $1\times10^{17}$–$1\times10^{18}$/cm$^3$.

Further high intensity of emitted light can be realized by controlling the thickness of the p-type active layer to 0.05–0.4 μm and the germanium concentration of the n-type cladding layer and the second n-type layer to $3\times10^{16}$ atoms/cm$^3$ or less.

The peak carbon concentration of the portion in the second n-type layer within 2 μm of the interface between the second n-type layer and the first n-type layer is controlled to less than $1\times10^{17}$ atoms/cm$^3$, thereby reducing occurrence of the thyristor defect in LEDs. The carbon concentration control is particularly effective for enhancing intensity of emitted light by thinning the active layer.

The epitaxial wafer of the present invention can provide infrared LEDs exhibiting high intensity of emitted light, which LEDs are suitable for large-capacity data transmission and long-distance data transmission. Particularly, incorporation of the LED of the present invention into a device which is employed in optical communications and spatial transmission provides high performance of the device which has never been attained.

What is claimed is:

1. An epitaxial wafer for fabricating an infrared light-emitting device, which wafer is obtained by sequentially forming, on an n-type GaAs substrate, a first n-type $Ga_{1-X1}Al_{X1}As$ layer (0<X1<1); a second n-type $Ga_{1-X2}Al_{X2}As$ layer (0<X2<1); an n-type $Ga_{1-X3}Al_{X3}As$ cladding layer (0<X3<1); a p-type $Ga_{1-X4}Al_{X4}As$ active layer (0<X4<1) which has an emission wavelength of 850–900 nm; and a p-type $Ga_{1-X5}Al_{X5}As$ cladding layer (0<X5<1), through liquid phase epitaxy, and, subsequently, removing the n-type GaAs substrate, wherein the peak carbon concentration of the portion in the second n-type $Ga_{1-x2}Al_{x2}As$ layer within 2 μm of the interface between the second n-type $Ga_{1-x2}Al_{x2}As$ layer and the first n-type $Ga_{1-X1}Al_{X1}As$ layer is less than $1\times10^{17}$ atoms/cm$^3$.

2. An epitaxial wafer for fabricating an infrared light-emitting device as claimed in claim 1 wherein the p-type $Ga_{1-X5}Al_{X5}As$ cladding layer has a thickness of 5–30 μm and the p-type GaAlAs cladding layer has an oxygen concentration of $3\times10^{16}$ atoms/cm$^3$ or less.

3. An epitaxial wafer for fabricating an infrared light-emitting device as claimed in claim 1 or 2, wherein the p-type $Ga_{1-X5}Al_{X5}As$ cladding layer has a carrier concentration of $1\times10^{17}$ atoms/cm$^3$ to $1\times10^{18}$ atoms/cm$^3$.

4. An epitaxial wafer for fabricating an infrared light-emitting device as claimed in claim 1 or 2, wherein the p-type $Ga_{1-X4}Al_{X4}As$ active layer has a thickness of 0.050–0.4 μm.

5. An epitaxial wafer for fabricating an infrared light-emitting device as claimed in claim 1 or 2, wherein the p-type $Ga_{1-X4}Al_{X4}As$ active layer contains germanium as a predominant dopant and the n-type $Ga_{1-X3}Al_{X3}As$ cladding layer has a germanium concentration of $3\times10^{16}$ atoms/cm$^3$ or less.

6. An epitaxial wafer for fabricating an infrared light-emitting device as claimed in claim 1 or 2, wherein the second n-type $Ga_{1-x2}Al_{x2}As$ layer has a germanium concentration of $3\times10^{16}$ atoms/cm$^3$ or less.

7. A light-emitting diode fabricated by use of an epitaxial wafer for fabricating an infrared light-emitting device as recited in any one of claims 1 or 2, further comprising an anode and a cathode operably connected to said epitaxial wafer.

8. An optical communications and spatial transmission apparatus employing a light-emitting diode as recited in claim 7, and further comprising a light-transmission medium operably connected to said light-emitting diode.

* * * * *